(12) United States Patent  
Gatineau

(10) Patent No.: US 8,357,614 B2
(45) Date of Patent: Jan. 22, 2013

(54) RUTHENIUM-CONTAINING PRECURSORS FOR CVD AND ALD

(75) Inventor: Satoko Gatineau, Ibaraki (JP)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 12/981,798

(22) Filed: Dec. 30, 2010

(65) Prior Publication Data

US 2011/0256721 A1    Oct. 20, 2011

Related U.S. Application Data

(60) Provisional application No. 61/325,487, filed on Apr. 19, 2010.

(51) Int. Cl.
*H01L 21/44* (2006.01)
*H01B 1/24* (2006.01)
*C07F 15/00* (2006.01)
*C23C 16/00* (2006.01)

(52) U.S. Cl. .................. 438/680; 427/255.19; 252/514; 556/136; 428/220

(58) Field of Classification Search .................. 438/608, 438/680; 257/E21.006; 427/255.19; 252/514; 556/136
See application file for complete search history.

(56) References Cited

U.S. PATENT DOCUMENTS

| | | | |
|---|---|---|---|
| 4,927,670 A | 5/1990 | Erbil | |
| 5,496,582 A | 3/1996 | Mizutani et al. | |
| 5,840,897 A | 11/1998 | Kirlin et al. | |
| 5,962,716 A | 10/1999 | Uhlenbrock et al. | |
| 6,063,705 A * | 5/2000 | Vaartstra ....................... | 438/681 |
| 6,074,945 A * | 6/2000 | Vaartstra et al. .............. | 438/681 |
| 6,133,159 A | 10/2000 | Vaartstra et al. | |
| 6,281,125 B1 | 8/2001 | Vaartstra et al. | |
| 6,380,080 B2 | 4/2002 | Visokay | |
| 6,429,127 B1 | 8/2002 | Derderian et al. | |
| 6,517,616 B2 | 2/2003 | Marsh et al. | |
| 6,541,067 B1 | 4/2003 | Marsh et al. | |
| 6,617,248 B1 | 9/2003 | Yang | |
| 6,743,935 B2 * | 6/2004 | Salzer et al. ................... | 556/136 |
| 6,844,261 B2 | 1/2005 | Marsh et al. | |
| 6,887,795 B2 * | 5/2005 | Soininen et al. .............. | 438/722 |
| 6,897,160 B2 | 5/2005 | Derderian et al. | |
| 7,018,675 B2 | 3/2006 | Yang | |
| 7,316,962 B2 | 1/2008 | Govindarajan | |
| 2002/0053299 A1 | 5/2002 | Marsh et al. | |
| 2002/0164887 A1 | 11/2002 | Tomita et al. | |
| 2003/0073294 A1 | 4/2003 | Marsh | |
| 2003/0092262 A1 | 5/2003 | Marsh et al. | |
| 2005/0009346 A1 | 1/2005 | Miyajima | |
| 2006/0162658 A1 | 7/2006 | Weidman | |
| 2006/0165892 A1 | 7/2006 | Weidman | |
| 2006/0246699 A1 | 11/2006 | Weidman et al. | |
| 2008/0152793 A1 | 6/2008 | Gatineau et al. | |
| 2009/0236568 A1 | 9/2009 | Letessier et al. | |
| 2009/0311500 A1 * | 12/2009 | Ye et al. ......................... | 428/220 |
| 2010/0221577 A1 | 9/2010 | Dussarrat | |

FOREIGN PATENT DOCUMENTS

| | | |
|---|---|---|
| EP | 1 717 343 | 11/2006 |
| JP | 2002 212112 | 7/2002 |
| JP | 2006 057112 | 3/2006 |
| WO | WO 00 12777 | 3/2000 |
| WO | WO 00 12779 | 3/2000 |
| WO | WO 00 015865 | 3/2000 |
| WO | WO 2004 046417 | 6/2004 |
| WO | WO 2008 034468 | 3/2008 |
| WO | WO 2008 078296 | 7/2008 |
| WO | WO 2008 088563 | 7/2008 |
| WO | WO 2009 118708 | 10/2009 |

OTHER PUBLICATIONS

Ingham, S.L. et al., "The synthesis, structure and selected reactivity of a series of tricarbonyl ruthenium complexes with 1,3-dienes and heterodynes," Journal of Organometallic Chemistry 574 (1999), pp. 302-310.
Kanjolia, R.K. et al., "Design and development of ALD precursors for microelectronics," ECS Transactions, (2008) 16 (4), pp. 79-86.
Sigma-Aldrich, "SAFC Expansion in Far East," Insight newsletter, Apr. 2008.
International Search Report and Written Opinion for related PCT/IB2011/051588, Jun. 21, 2011.
Bottrill, M. at al., "Reactions of co-ordinated ligands. Part 16. The oxidative-addition of hexafluorobut-2-yne and 3,3,3-trifluoroprop-1-yne to tricarbonyl(1,3-diene)-iron and—ruthenium and tricarbonyi(diphenyl-o-styrylphosphine)-iron complexes: Crystal and molecular structure of $[Ru(CO)_3\{P(OCH_2)_3\text{-}CMe\}(C_8H_8)(C_4F_6)_2]$," J. Chem. Soc., Jan. 1977, pp. 1252-1261.
Burkey, D.J. et al. "Encapsulated alkaline-earth metallocenes. 2. Triisopropylcyclopentadienyl systems, $[(C_3H_7)_3C_5H_2]_2Ae(THF)$, (Ae = Ca, Sr, Ba; n = 0-2), and the crystal structure of $[(C_3H_7)_3C_5H_2]_2Ba(THF)_2$." Organometallics, vol. 12, No. 4, 1993, pp. 1331-1337.
Fröhlich, K. et at., "Preparation of Sr $RuO_3$ films for advanced CMOS metal gates," Materials Science in Semiconductor Processing 7 (2004), pp. 265-269.
Hatanpää, T. et al., "Synthesis and characterisation of cyclopentadienyl complexes of barium: Precursors for atomic layer deposition of $BaTiO_3$," Dalton Transactions, Mar. 8, 2004, pp. 1181-1188.
Kang, J. et al, "Metal-organic CVD of a (Ba,Sr)RuO3 oxide electrode using a single cocktail source," Chemical Vapor Deposition 11 (2005), pp. 17-20.
Kirss, R.U., "Synthesis, characterization and spectroscopy of alkyl substituted edge-bridged open ruthenocenes," Inorganica Chimica Acta 357 (2004), pp. 3181-3186.
Kukli, K. et al., "Atomic layer deposition of calcium oxide and calcium hafnium oxide films using calcium cyclopentadienyl precursor," Thin Solid Films 500 (2006), pp. 322-329.
Shibutami, T. et al. "Novel ruthenium precursor for MOCVD without seed ruthenium layer," Tosoh R&D Review, 47, 2003, pp. 61-64.

(Continued)

*Primary Examiner* — William D Coleman
(74) *Attorney, Agent, or Firm* — Patricia E. McQueeney

(57) ABSTRACT

Disclosed are ruthenium-containing precursors and methods of using the same in CVD and ALD.

17 Claims, 1 Drawing Sheet

OTHER PUBLICATIONS

Shibuya, K. et al. "Domain structure of epitaxial $CaHfO_3$ gate insulator films on $SrTiO_3$", Appl. Phys. Let. 84 (2004) 2142-2144.

Shibuya, K. et al. "Growth and structure of wide-gap insulator films on $SrTiO_3$", Solid State Electron., 47 (2003) 2211-2214.

Sosinsky, B.A. et al. "Hydrocarbon complexes of ruthenium. IV. Cyclic dienyl complexes". J. Chemical Society, Daltan Transactions, Chemical Society. Letchworth, GB, 1974, pp. 1633-1640.

Strem MSDS (Ruthenocene Oct. 2004) {http://www.strem.com/catalog/v3/44/6200/}.

Studebaker, D. et al. "Low field, room temperature magnetoresistance in $(La_{y-x}M_x)_y MnO_{3-\delta}$ (M=Ca, Sr) thin-films deposited by liquid delivery CVD". Materials Science and Engineering B56 (1998) pp. 168-172.

Vehkamaki, M. et al. "Atomic layer deposition of $BaTiO_3$ thin films—Effect of barium hydroxide formation." Chemical Vapor Deposition, vol. 13, No. 5, May 1, 2007, pp. 239-246.

International Search Report and Written Opinion for related PCT/EP2006/066639, Feb. 22, 2007.

International Search Report and Written Opinion for related PCT/IB2009/051276, Jul. 6, 2009.

International Search Report and Written Opinion for PCT/I62009/051153, Nov. 26, 2009.

* cited by examiner

RUTHENIUM-CONTAINING PRECURSORS FOR CVD AND ALD

CROSS-REFERENCE TO RELATED APPLICATIONS

This application claims the benefit under 35 U.S.C. §119(e) to provisional application No. 61/325,487, filed Apr. 19, 2010, the entire contents of which are incorporated herein by reference.

TECHNICAL FIELD

Disclosed are ruthenium-containing precursors and methods of using the same in CVD and ALD.

BACKGROUND

Ruthenium films and ruthenium-containing films, such as SrRuO and $RuO_2$, have been used for several parts in semiconductor devices such as metal electrode and Cu seed layer. The resistivity of ruthenium is lower than that of Ir and Pt. Additionally, $RuO_2$ has better conductivity than the two corresponding Ir and Pt metal oxides, which is important when the deposited metal layer is contacted with oxidizing agents (e.g., $O_2$, $O_3$) during subsequent processes. As the size of chip becomes smaller, each layer must be thinner. Therefore chemical vapor deposition (CVD) and preferably atomic layer deposition (ALD) techniques are desired and precursors which can be used in CVD and ALD mode are also desired.

A large variety of ruthenium complexes are available and some have been studied in CVD or ALD mode. However, most of them have drawbacks, such as low vapor pressure and/or deposition of films exhibiting high impurity contents (C and O in most of the cases), long incubation time, poor adherence, and non-uniformity in deep trenches. Besides, some precursors are not liquid and need to be dissolved in a solvent or mixture of solvents to allow an easy delivery of the vapors to the reaction chamber.

Tricarbonyl ruthenium products were reported as CVD/ALD precursors (see, e.g., U.S. Pat. Nos. 6,517,616 and 6,897,160 and JP2002-212112). PCT Publication No WO2008/034468 discloses $(R_n$—CHD$)Ru(CO)_3$ precursors, wherein R is selected from the group consisting of C1-C4 linear or branched alkyl, alkylamides, alkoxides, alkylsilyamides, amidinates, carbonyl, and/or fluoroalkyl substituents and n may range from 1 to 8.

A need remains for ruthenium-containing precursors having properties suitable for vapor deposition.

NOTATION AND NOMENCLATURE

Certain abbreviations, symbols, and terms are used throughout the following description and claims and include: the term "unsaturated hydrocarbon" refers to unsaturated functional groups containing exclusively carbon and hydrogen atoms. Further, the term "unsaturated hydrocarbon" refers to linear, branched, or cyclic unsaturated hydrocarbon groups. Examples of linear unsaturated hydrocarbon groups include without limitation, ethylene groups, propylene groups, butene groups, etc. Examples of branched unsaturated hydrocarbon groups include without limitation, 2-methyl-2,4-pentadiene. Examples of cyclic unsaturated hydrocarbon groups include without limitation, cyclohexadienyl groups, etc.

The abbreviation "Me" refers to a methyl group; the abbreviation "Et" refers to an ethyl group; the abbreviation "Pr" refers to a propyl group; the abbreviation "iPr" refers to an isopropyl group; the abbreviation "Bu" refers to butyl (n-butyl); the abbreviation "tBu" refers to tert-butyl; the abbreviation "sBu" refers to sec-butyl; and the abbreviation "CHD" refers to cyclohexadienyl.

The standard abbreviations of the elements from the periodic table of elements are used herein. It should be understood that elements may be referred to by these abbreviations (e.g., Ru refers to ruthenium, Sr refers to strontium, etc.).

SUMMARY

Disclosed are methods of forming ruthenium-containing layers on substrates. A reaction chamber is provided having at least one substrate disposed within it. A vapor is introduced into the reaction chamber. The vapor comprises at least one compound having the formula $[L]_m Ru(CO)_3$; wherein L is a linear or branched unsaturated hydrocarbon or a cyclic unsaturated hydrocarbon having two or more substituents and m is 1 or 2. The vapor is contacted with the substrate to form the ruthenium-containing layer on at least one surface of the substrate using a vapor deposition process. The method may further include one or more of the following aspects:

- the vapor deposition process being CVD and/or ALD;
- L being selected from the group consisting of ethylene, propylene, butene, 2,4-pentadiene, 2-methyl-2,4-pentadiene, 1,4-pentadiene, 2,4-hexadiene, 2,4-hexadienal, 2,4-heptadiene, 1,4-dimethyl-1,3-cyclohexadiene, 1-methyl-4-ethyl-1,3-cyclohexadiene, 1-methyl-4-n-propyl-1,3-cyclohexadiene, 1-methyl-4-isopropyl-1,3-cyclohexadiene, 1-methyl-5-methyl-1,4-cyclohexadiene, 1-methyl-5-ethyl-1,4-cyclohexadiene, 1-methyl-5-n-propyl-1,4-cyclohexadiene, and 1-methyl-5-isopropyl-1,4-cyclohexadiene;
- the at least one compound being selected from the group consisting of $Ru(ethylene)_2(CO)_3$, $Ru(propylene)_2(CO)_3$, $Ru(butene)_2(CO)_3$, $Ru(2,4\text{-pentadiene})(CO)_3$, $Ru(2\text{-methyl-}2,4\text{-pentadiene})(CO)_3$, $Ru(1,4\text{-pentadiene})(CO)_3$, $Ru(2,4\text{-hexadiene})(CO)_3$, $Ru(2,4\text{-hexadienal})(CO)_3$, $Ru(2,4\text{-heptadiene})(CO)_3$, $Ru(1,4\text{-dimethyl-}1,3\text{-cyclohexadiene})(CO)_3$, $Ru(1\text{-methyl-4-ethyl-}1,3\text{-cyclohexadiene})(CO)_3$, $Ru(1\text{-methyl-4-n-propyl-}1,3\text{-cyclohexadiene})(CO)_3$, $Ru(1\text{-methyl-4-isopropyl-}1,3\text{-cyclohexadiene})(CO)_3$, $Ru(1,5\text{-dimethyl-}1,4\text{-cyclohexadiene})(CO)_3$, $Ru(1\text{-methyl-5-ethyl-}1,4\text{-cyclohexadiene})(CO)_3$, $Ru(1\text{-methyl-5-n-propyl-}1,4\text{-cyclohexadiene})(CO)_3$, and $Ru(1\text{-methyl-5-isopropyl-}1,4\text{-cyclohexadiene})(CO)_3$,
- L being "C=C—C=C" or "C=C—$CH_2$—C=C";
- the at least one compound being a liquid at a temperature ranging between approximately −20° C. and approximately 100° C.;
- the at least one compound being a liquid at a temperature ranges between approximately −20° C. and approximately 30° C.;
- the at least one compound being a liquid at a temperature ranges between approximately −20° C. and approximately 0° C.;
- the vapor deposition process being a thermal vapor deposition process or a plasma vapor deposition process;
- the reaction chamber containing between 1 and 200 wafers;
- the vapor deposition process being performed in a pressure range of about 0.01 Torr (1.33 Pa) to about 1000 Torr (133,322 Pa);

the vapor deposition process being performed in a pressure range of about 0.1 Torr (13.3 Pa) to about 100 Torr (13,332.2 Pa);

the vapor deposition process is performed in a temperature range of about 10° C. to about 400° C.;

the vapor deposition process is performed in a temperature range is about 25° C. to about 350° C.;

the vapor deposition process is performed in a temperature range is about 50° C. to about 300° C.;

introducing a reactant into the reaction chamber;

the reactant being a reducing agent selected from the group consisting of hydrogen ($H_2$), ammonia ($NH_3$), silane ($SiH_4$), diethylsilane ($SiEt_2H_2$), excited species of the same, and mixtures thereof; and the reactant being an oxidizing agent selected from the group consisting of oxygen ($O_2$), water ($H_2O$), ozone ($O_3$), $H_2O_2$, NO, $NO_2$, carboxylic acids (RCOOH), excited species of the same, and mixtures thereof.

BRIEF DESCRIPTION OF THE FIGURES

For a further understanding of the nature and objects of the present invention, reference should be made to the following detailed description, taken in conjunction with the accompanying figure wherein.

DETAILED DESCRIPTION OF PREFERRED EMBODIMENTS

Figure 1:
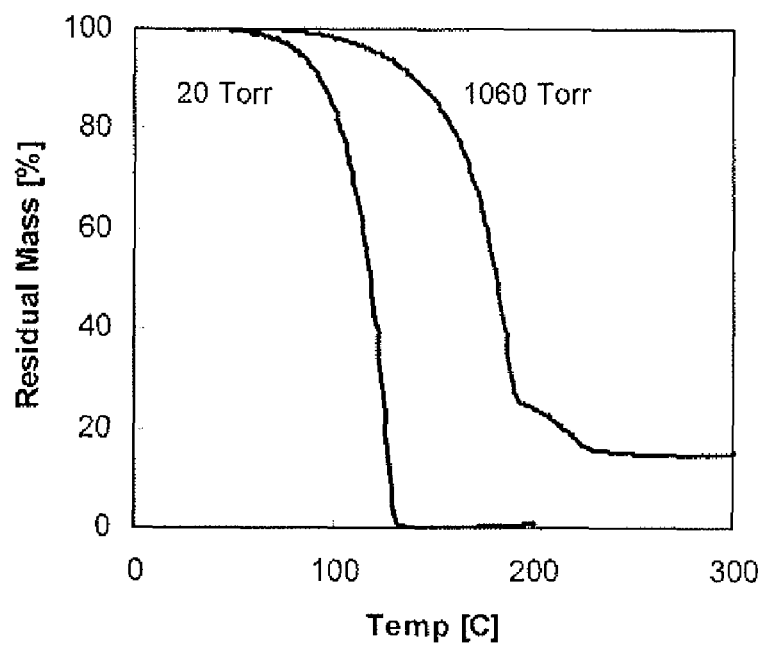
FIG. 1 is a graph of the thermogravimetric analysis (TGA) showing percent mass loss versus temperature for Ru(1-methyl-4-isopropyl-1,3-cyclohexadiene)$(CO)_3$.

Disclosed are ruthenium-containing precursors. The disclosed precursors may be thermally stable (in delivery conditions) for use in CVD and ALD depositions with high reactivity.

The disclosed precursors are metal tricarbonyl complexes having the general formula $L_mRu(CO)_3$, wherein L is a linear or branched unsaturated hydrocarbon or a cyclic unsaturated hydrocarbon having two or more substituents; and m is 1 or 2.

In one embodiment, disclosed precursors have the formula $L_2Ru(CO)_3$ and the Ls are linear unsaturated hydrocarbons, such as ethylene, propylene, or butene. Exemplary precursors include Ru(ethylene)$_2(CO)_3$, Ru(propylene)$_2(CO)_3$, and Ru(butene)$_2(CO)_3$.

In an alternate embodiment, the disclosed precursors have the formula $LRu(CO)_3$ and the Ls are bound to the Ru atom as depicted below:

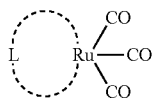

In this embodiment, the L may be 2,4-pentadiene, 2-methyl-2,4-pentadiene, 1,4-pentadiene, 2,4-hexadiene, 2,4-hexadienal, 2,4-heptadiene. Alternatively, the L may be cyclohexadiene molecules having 2 or more substituents, such as 1,4-dimethyl-1,3-cyclohexadiene, 1-methyl-4-ethyl-1,3-cyclohexadiene, 1-methyl-4-n-propyl-1,3-cyclohexadiene, 1-methyl-4-isopropyl-1,3-cyclohexadiene, 1-methyl-5-methyl-1,4-cyclohexadiene, 1-methyl-5-ethyl-1,4-cyclohexadiene, 1-methyl-5-n-propyl-1,4-cyclohexadiene, 1-methyl-5-isopropyl-1,4-cyclohexadiene. Exemplary precursors include Ru(2,4-pentadiene)$(CO)_3$, Ru(2-methyl-2,4-pentadiene)$(CO)_3$, Ru(1,4-pentadiene)$(CO)_3$, Ru(2,4-hexadiene)$(CO)_3$, Ru(2,4-hexadienal)$(CO)_3$, Ru(2,4-heptadiene)$(CO)_3$, Ru(1,4-dimethyl-1,3-cyclohexadiene)$(CO)_3$, Ru(1-methyl-4-ethyl-1,3-cyclohexadiene)$(CO)_3$, Ru(1-methyl-4-n-propyl-1,3-cyclohexadiene)$(CO)_3$, Ru(1-methyl-4-isopropyl-1,3-cyclohexadiene)$(CO)_3$, Ru(1,5-dimethyl-1,4-cyclohexadiene)$(CO)_3$, Ru(1-methyl-5-ethyl-1,4-cyclohexadiene)$(CO)_3$, and Ru(1-methyl-5-n-propyl-1,4-cyclohexadiene)$(CO)_3$. Preferably, the precursor is Ru(1-methyl-4-isopropyl-1,3-cyclohexadiene)$(CO)_3$.

The disclosed precursors are preferably liquid at a temperature ranging between approximately −20° C. and approximately 100° C., more preferably between approximately −20° C. and approximately 30° C., and even more preferably between approximately −20° C. and approximately 0° C.

Ligand Selection

Some $L_mRu(CO)_3$ compounds exhibit suitable properties for CVD/ALD deposition. Selection of the L ligand may be based upon the intended use of the resulting ruthenium-containing layer. However, the oxidation state of the ruthenium atom and steric hindrance of a ligand L are not always same and some structures may not be made.

For example, when L is not a neutral ligand (e.g., substituted cyclopentadiene), the oxidation states of ruthenium in the $L_mRu(CO)_3$ compound is not zero, resulting in a stable $L_mRu(CO)_3$ compound. In such cases, oxygen is needed in the CVD or ALD process in order to break the bond between the Ru atom and non-neutral L ligand. As a result, the resulting ruthenium-containing layer may also contain oxygen.

However, when L is a neutral ligand (e.g., diene (m=1) or an unsaturated hydrocarbon (m=1 or 2)), the oxidation state of the ruthenium in the $L_mRu(CO)_3$ compound is zero. In that situation, oxygen or ozone may not be necessary to break the bond. Hydrogen may possibly be used instead of oxygen. The resulting Ru-containing layer may be applied for some parts where oxygen can not be used, such as a barrier layer.

Active Site

In addition to the ligand selection described above, some ligands are not capable of making the $L_mRu(CO)_3$ structure. The ligand molecule, L, may be "C(1)=C(2)-C(3)=C(4)" or "C(5)=C(6)-C(7)$H_2$—C(8)=C(9)." In the case of diene molecule, two double bonds should be closer and C(2), (3), (6), (8) should have no substitution group (besides hydrogen) on the carbon. In other words, a 1,3-diene molecule is preferable to a 1,4-diene molecule.

Additionally, any non-hydrogen substituents on the C(2), (3), (6), or (8) carbon molecules may hinder $L_mM(CO)_3$ molecule formation. To avoid steric hindrance, the ligand molecule may need an "open site" to produce the tbp (trigonal bipyramidal) structure. For example, when the ligand does not have an active site, such as L=1-methyl-4-isopropyl-1,4-cyclohexadiene or 1,3,5-trimethyl-1,4-cyclohexadiene, the $LM(CO)_3$ product was not obtained.

Deposition Method

The disclosed precursors may be used to form ruthenium-containing layers on one or more substrates (e.g., a semiconductor substrate or substrate assembly) using a vapor deposition process. The methods may be useful in the manufacture of semiconductor, photovoltaic, LCD-TFT, and flat panel devices. The method includes: providing a substrate; providing a vapor including at least one ruthenium-containing precursor; and contacting the vapor including the ruthenium-containing precursor with the substrate (and typically directing the vapor to the substrate); and providing a vapor of a reducing or oxidizing agent to the substrate in order to form a ruthenium-containing layer, on at least one surface of the substrate.

The disclosed precursor compounds may be deposited to form ruthenium-containing films using any deposition methods known to those of skill in the art. Examples of suitable deposition methods include without limitation, conventional chemical vapor deposition (CVD), plasma enhanced chemical vapor deposition (PECVD), low pressure chemical vapor deposition (LPCVD), atomic layer deposition (ALD), pulsed chemical vapor deposition (P-CVD), plasma enhanced atomic layer deposition (PE-ALD), combinations thereof, and/or in any other deposition technique known to the skilled in the art. Preferably, the deposition method is a thermal or plasma vapor deposition process. More preferably, the deposition method is ALD or PE-ALD.

The vapor of the precursor is introduced into a reaction chamber containing at least one substrate. The reaction chamber may contain from 1 to 200 wafers. The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems.

The temperature and the pressure within the reaction chamber and the temperature of the substrate are held at suitable conditions so that contact between the vapor of the ruthenium-containing precursor and substrate results in formation of a Ru-containing layer on at least one surface of the substrate. A reactant may also be used to help in formation of the Ru-containing layer.

The reaction chamber may be maintained at a pressure ranging from about 0.01 Torr (1.33 Pa) to about 1000 Torr (133,322 Pa), more preferably in the range of about 0.1 Torr (13.3 Pa) to about 100 Torr (13,332.2 Pa). The temperature within the reaction chamber may range from about 10° C. to about 100° C., preferably from about 25° C. to about 350° C., and more preferably from about 50° C. to about 300° C. One of ordinary skill in the art will recognize that the temperature may be optimized through mere experimentation to achieve the desired result.

The type of substrate upon which the ruthenium-containing film will be deposited will vary depending on the final use intended. In some embodiments, the substrate may be chosen from oxides which are used as dielectric materials in MIM, DRAM, FeRam technologies or gate dielectrics in CMOS technologies (for example, $RuO_2$ based materials, ternary oxide based materials, etc.) or from nitride-based films (for example, RuN) that are used as an oxygen barrier between copper and the low-k layer. Other substrates may be used in the manufacture of semiconductors, photovoltaics, LCD-TFT, or flat panel devices. Examples of such substrates include, but are not limited to, solid substrates such as metal substrates (for example, Au, Pd, Rh, Ru, W, Al, Ni, Ti, Co, Pt and metal silicides, such as $TiSi_2$, $CoSi_2$, and $NiSi_2$); metal nitride containing substrates (for example, TaN, TiN, TiAlN, WN, TaCN, TiCN, TaSiN, and TiSiN); semiconductor materials (for example, Si, SiGe, GaAs, InP, diamond, GaN, and SiC); insulators (for example, $SiO_2$, $Si_3N_4$, SiON, $HfO_2$, $Ta_2O_5$, $ZrO_2$, $TiO_2$, $Al_2O_3$, and barium strontium titanate); or other substrates that include any number of combinations of these materials. The actual substrate utilized may also depend upon the specific precursor embodiment utilized. In many instances though, the preferred substrate utilized will be selected from TiN, Ru, and Si type substrates.

The substrate may be heated to a sufficient temperature to obtain the desired ruthenium or ruthenium-containing film at a sufficient growth rate and with desired physical state and composition. A non-limiting exemplary temperature range to which the substrate may be heated includes from 150° C. to 600° C. Preferably, the temperature of the substrate remains less than or equal to 450° C.

The precursor may be fed in liquid state to a vaporizer where it is vaporized before it is introduced into the reaction chamber. Prior to its vaporization, the precursor may optionally be mixed with one or more solvents, one or more metal sources, and a mixture of one or more solvents and one or more metal sources. The solvents may be selected from the group consisting of toluene, ethyl benzene, xylene, mesitylene, decane, dodecane, octane, hexane, pentane, or others. The resulting concentration may range from approximately 0.05 M to approximately 2 M. The metal source may include any metal precursors now known or later developed.

Alternatively, the precursor may be vaporized by passing a carrier gas into a container containing the precursor or by bubbling the carrier gas into the precursor. The carrier gas and precursor are then introduced into the reaction chamber as a vapor. The carrier gas may include, but is not limited to, Ar, He, $N_2$, and mixtures thereof. The precursor may optionally be mixed in the container with a solvent, another metal precursor, or a mixture thereof. If necessary, the container may be heated to a temperature that permits the precursor to be in its liquid phase and to have a sufficient vapor pressure. The container may be maintained at temperatures in the range of, for example, 0-150° C. Those skilled in the art recognize that the temperature of the container may be adjusted in a known manner to control the amount of precursor vaporized.

In addition to the optional mixing of the precursor with solvents, metal precursors, and stabilizers prior to introduction into the reaction chamber, the precursor may be mixed with reactants inside the reaction chamber. Exemplary reactants include, without limitation, $H_2$, hydrogen containing fluids, alcohol (ROH, R being a C1-C6 alkyl), metal precursors such as strontium-containing precursors, barium-containing cursors, aluminum-containing precursors such as TMA, and any combination thereof.

When the desired ruthenium-containing film also contains oxygen, such as, for example and without limitation, $RuO_2$, the reactant may include an oxygen source which is selected from, but not limited to, $O_2$, $O_3$, $H_2O$, $H_2O_2$, acetic acid, formalin, para-formaldehyde, and combinations thereof.

When the desired ruthenium-containing film also contains nitrogen, such as, for example and without limitation, ruthenium nitride, the reactant may include a nitrogen source which is selected from, but not limited to, nitrogen ($N_2$), ammonia and alkyl derivatives thereof, imines, hydrazine and alkyl derivatives thereof, N-containing radicals (for instance N., NH., $NH_2$.), NO, $N_2O$, $NO_2$, amines, and any combination thereof.

When the desired ruthenium-containing film also contains carbon, such as, for example and without limitation, ruthenium carbide, the reactant may include a carbon source which is selected from, but not limited to, methane, ethane, propane, butane, ethylene, propylene, t-butylene, isobutylene, $CCl_4$, and any combination thereof.

When the desired ruthenium-containing film also contains silicon, such as, for example and without limitation, ruthenium silicide or ruthenium silicate, the reactant may include a silicon source which is selected from, but not limited to, $SiH_4$, $Si_2H_6$, $Si_3H_8$, TriDMAS, BDMAS, BDEAS, IDEAS, TDMAS, TEMAS, $(SiH_3)_3N$, $(SiH_3)_2O$, trisilylamine, disiloxane, trisilylamine, disilane, trisilane, an alkoxysilane $SiH_x(OR^1)_{4-x}$, a silanol $Si(OH)_x(OR^1)_{4-x}$ (preferably $Si(OH)(OR^1)_3$; more preferably $Si(OH)(OtBu)_3$ an aminosilane $SiH_x(NR^1R^2)_{4-x}$ (where x is 1, 2, 3, or 4; $R^1$ and $R^2$ are independently H or a linear, branched or cyclic C1-C6 carbon chain; preferably TriDMAS, BTBAS, and/or BDEAS), and any combination thereof. The targeted film may alternatively contain Germanium (Ge), in which case the above-mentioned Si-containing reactant could be replaced by Ge-containing reactant.

When the desired ruthenium-containing film also contains another metal, such as, for example and without limitation, B, In, Zn, Au, Pd, Ag, Ti, Ta, Hf, Zr, Nb, Mg, Al, Sr, Y, Ba, Ca, As, Sb, Bi, Sn, Pb, or combinations thereof, the reactant may include a second precursor containing the metal. The second precursor may be selected from, but not limited to, metal alkyls such as $B_2H_6$, $SbR''_3$ or $SnR''_4$ (wherein each $R''$ is independently H or a linear, branched, or cyclic C1-C6 carbon chain), metal alkoxides such as $Sb(OR^i)_3$ or $Sn(OR^i)_4$ (where each $R^i$ is independently H or a linear, branched, or cyclic C1-C6 carbon chain), and metal amines such as $Sb(NR^1R^2)(NR^3R^4)(NR^5R^6)$ or $Ge(NR^1R^2)(NR^3R^4)(NR^5R^6)(NR^7R^8)$ (where each $R^1$, $R^2$, $R^3$, $R^4$, $R^5$, $R^6$, $R^7$, and $R^8$ is independently H, a C1-C6 carbon chain, or a trialkylsilyl group, the carbon chain and trialkylsilyl group each being linear, branched, or cyclic), and any combination thereof.

In one preferred embodiment, the reactant may be a reducing agent selected among, but not limited to, hydrogen ($H_2$), ammonia ($NH_3$), silane ($SiH_4$), diethylsilane ($SiEt_2H_2$), excited species of the same, and mixture thereof. In another preferred embodiment, the reactant may be an oxidizing agent selected among, but is not limited to, oxygen ($O_2$), water ($H_2O$), ozone ($O_3$), $H_2O_2$, NO, $NO_2$, carboxylic acids (RCOOH), excited species of the same, and mixtures thereof.

The precursor and one or more reactants may be introduced into the reaction chamber simultaneously (chemical vapor deposition), sequentially (atomic layer deposition), or in other combinations. For example, the precursor may be introduced in one pulse and two additional metal sources may be introduced together in a separate pulse [modified atomic layer deposition]. Alternatively, the reaction chamber may already contain the reactant prior to introduction of the precursor. The reactant may be passed through a plasma system localized remotely from the reaction chamber, and decomposed to radicals. Alternatively, the precursor may be introduced to the reaction chamber continuously while other metal sources are introduced by pulse (pulsed-chemical vapor deposition). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s.

In one non-limiting exemplary atomic layer deposition type process, the vapor phase of the disclosed precursor is introduced into the reaction chamber, where it is contacted with a suitable substrate. Excess precursor may then be removed from the reaction chamber by purging and/or evacuating the reactor. An oxygen source is introduced into the reaction chamber where it reacts with the absorbed precursor in a self-limiting manner. Any excess oxygen source is removed from the reaction chamber by purging and/or evacuating the reaction chamber. If the desired film is a ruthenium oxide film, this two-step process may provide the desired film thickness or may be repeated until a film having the necessary thickness has been obtained.

Alternatively, if the desired film is a ruthenium metal oxide film, the two-step process above may be followed by introduction of the vapor of a metal precursor into the reaction chamber. The metal precursor will be selected based on the nature of the ruthenium metal oxide being deposited. After introduction into the reaction chamber, the metal precursor is contacted with the substrate. Any excess metal precursor is removed from the reaction chamber by purging and/or evacuating the reaction chamber. Once again, an oxygen source may be introduced into the reaction chamber to react with the second metal precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the precursor, metal precursor, and oxygen source, a film of desired composition and thickness can be deposited.

The ruthenium-containing films or layers resulting from the processes discussed above may include SrRuO and $RuO_2$. One of ordinary skill in the art will recognize that by judicial selection of the appropriate precursor and reactants, the desired film composition may be obtained.

EXAMPLE

The following non-limiting example is provided to further illustrate embodiments of the invention. However, the example is not intended to be all inclusive and is not intended to limit the scope of the inventions described herein.

Synthesis of Ru(1-methyl-4-isopropyl-1,3-cyclohexadiene)(CO)$_3$ $Ru_3(CO)_{12}$ (10 g, 15.6 mmol) was mixed with 1-methyl-4-isopropyl-1,3-cyclohexadiene (25 ml, 0.15 mol) in 200 ml of toluene under reflux for 17 hours. After reaction, excess solvent and ligand molecule was removed under vacuumed pressure. Remaining liquid was distilled under vacuumed pressure twice and slight yellow liquid was obtained, 70° C./20 mmHg, as a final product (yield ca. 82%). As another purification method, the product was separated by column chromatography (silica gel, solvent hexane). Slight yellow fraction (Rf=0.7) was collected and the solvent was removed under vacuumed pressure at room temperature.

FIG. 1 is a graph of the thermogravimetric analysis (TGA) showing percent mass loss versus temperature for Ru(1-methyl-4-isopropyl-1,3-cyclohexadiene)(CO)$_3$. The TGA results show good evaporation without any residue at 20 Torr.

Figure 2:
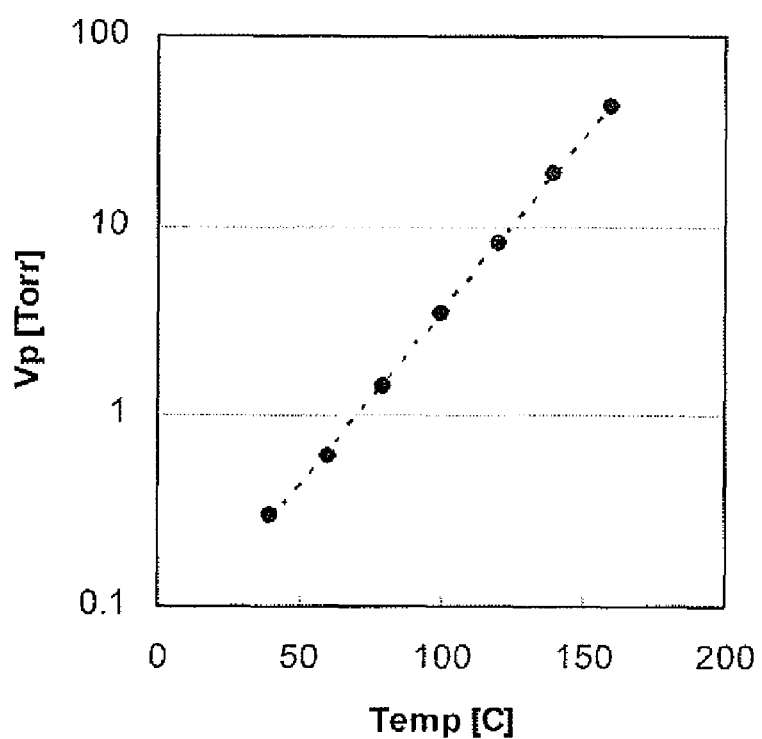
FIG. 2 is a graph of the vapor pressure versus temperature for Ru(1-methyl-4-isopropyl-1,3-cyclohexadiene)$(CO)_3$.

FIG. 2 is a graph of the vapor pressure versus temperature for Ru(1-methyl-4-isopropyl-1,3-cyclohexadiene)(CO)$_3$. In Vp=16.624-5672.8/T, ΔH=47 kJ/mol.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of forming a ruthenium-containing layer on a substrate, the method comprising:
   a) providing a reaction chamber having at least one substrate disposed therein;
   b) introducing into the reaction chamber a vapor comprising at least one compound having the formula $[L]_m Ru(CO)_3$, wherein L is selected from the group consisting of ethylene, propylene, butene, 2,4-pentadiene, 2-methyl-2,4-pentadiene, 1,4-pentadiene, 2,4-hexadiene, 2,4-hexadienal, 2,4-heptadiene, 1,4-dimethyl-1,3-cyclohexadiene, 1-methyl-4-ethyl-1,3-cyclohexadiene, 1-methyl-4-n-propyl-1,3-cyclohexadiene, 1-methyl-4-isopropyl-1,3-cyclohexadiene, 1-methyl-5-methyl-1,4-cyclohexadiene, 1-methyl-5-ethyl-1,4-cyclohexadiene, 1-methyl-5-n-propyl-1,4-cyclohexadiene, and 1-methyl-5-isopropyl-1,4-cyclohexadiene and m is 1 or 2; and
   c) contacting the vapor with the substrate to form the ruthenium-containing layer on at least one surface of the substrate using a vapor deposition process.

2. The method of claim 1, wherein the vapor deposition process is CVD and/or ALD.

3. The method of claim 1, wherein the at least one compound is selected from the group consisting of Ru(ethylene)$_2$(CO)$_3$, Ru(propylene)$_2$(CO)$_3$, Ru(butene)$_2$(CO)$_3$, Ru(2,4-pentadiene)(CO)$_3$, Ru(2-methyl-2,4-pentadiene)(CO)$_3$, Ru(1,4-pentadiene)(CO)$_3$, Ru(2,4-hexadiene)(CO)$_3$, Ru(2,4-hexadienal)(CO)$_3$, Ru(2,4-heptadiene)(CO)$_3$, Ru(1,4-dimethyl-1,3-cyclohexadiene)(CO)$_3$, Ru(1-methy-4-ethyl-1,3-cyclohexadiene)(CO)$_3$, Ru(1-methy-4-n-propyl-1,3-cyclohexadiene)(CO)$_3$, Ru(1-methyl-4-isopropyl-1,3-cyclohexadiene)(CO)$_3$, Ru(1,5-dimethy-1,4-cyclohexadiene)(CO)$_3$, Ru(1-methy-5-ethyl-1,4-cyclohexadiene)(CO)$_3$, Ru(1-methy-5-n-propyl-1,4-cyclohexadiene)(CO)$_3$, and Ru(1-methy-5-isopropyl-1,4-cyclohexadiene)(CO)$_3$.

4. The method of claim 1, wherein L is "C=C—C=C" or "C=C—CH$_2$—C=C."

5. The method of claim 1, wherein the at least one compound is a liquid at a temperature ranging between approximately −20° C. and approximately 100° C.

6. The method of claim 1, wherein the reaction chamber contains between 1 and 200 wafers.

7. The method of claim 1, wherein the vapor deposition process is performed in a pressure range of about 0.01 Torr (1.33 Pa) to about 100 Torr (133,322 Pa).

8. The method of claim 1, wherein the vapor deposition process is performed in a temperature range of about 10° C. to about 400° C.

9. The method of claim 1, further comprising introducing a reactant into the reaction chamber.

10. The method of claim 2, wherein the vapor deposition process is a thermal vapor deposition process or a plasma vapor deposition process.

11. The method of claim 5, wherein the temperature ranges between approximately −20° C. and approximately 30° C.

12. The method of claim 7, wherein the pressure range is about 0.1 Torr (13.3 Pa) to about 100 Torr (13,332.2 Pa).

13. The method of claim 8, wherein the temperature range is about 25° C. to about 350° C.

14. The method of claim 9, wherein the reactant is a reducing agent selected from the group consisting of hydrogen (H$_2$), ammonia (NH$_3$), silane (SiH$_4$), diethylsilane (SiEt$_2$H$_2$), excited species of the same, and mixtures thereof.

15. The method of claim 9, wherein the reactant is an oxidizing agent selected from the group consisting of oxygen (O$_2$), water (H$_2$O), ozone (O$_3$), H$_2$O$_2$, NO, NO$_2$, carboxylic acids (RCOOH), excited species of the same, and mixtures thereof.

16. The method of claim 11, wherein the temperature ranges between approximately −20° C. and approximately 0° C.

17. The method of claim 13, wherein the temperature range is about 50° C. to about 300° C.

* * * * *